(12) United States Patent
Gudesen et al.

(10) Patent No.: US 6,952,361 B2
(45) Date of Patent: Oct. 4, 2005

(54) VOLUMETRIC DATA STORAGE APPARATUS

(75) Inventors: Hans Gude Gudesen, Brussels (BE); Geirr I. Leistad, Sandvika (NO)

(73) Assignee: Thin Film Electronics, Oslo (NO)

( * ) Notice: Subject to any disclaimer, the term of this patent is extended or adjusted under 35 U.S.C. 154(b) by 65 days.

(21) Appl. No.: 10/395,245

(22) Filed: Mar. 25, 2003

(65) Prior Publication Data

US 2004/0004887 A1 Jan. 8, 2004

(30) Foreign Application Priority Data

Mar. 25, 2002 (NO) .......................................... 20021466

(51) Int. Cl.$^7$ ............................................. G11C 11/22
(52) U.S. Cl. ...................................... 365/145; 365/171
(58) Field of Search ................................. 365/145, 171

(56) References Cited

U.S. PATENT DOCUMENTS

| | | | |
|---|---|---|---|
| 6,775,173 B2 * | 8/2004 | Gudesen | ..................... 365/145 |
| 2003/0001151 A1 | 1/2003 | Li et al. | |
| 2003/0056078 A1 | 3/2003 | Johansson et al. | |

* cited by examiner

Primary Examiner—Van Thu Nguyen
Assistant Examiner—Pho M. Luu
(74) Attorney, Agent, or Firm—Birch, Stewart, Kolasch & Birch, LLP (57) ABSTRACT

In a volumetric data storage apparatus comprising a plurality of stacked matrix-addressable memory devices electrode means are provided so as to form alternating word and bit line means for the memory devices, whereby the number of the electrode means is only one more than the number of memory devices. Moreover adjoining electrode means are arranged in such a manner as to furnish a high proportion of memory cells which can be switched in two or more directions, thus yielding a much higher output when addressed and having an improved signal-to-noise ratio. Each memory device can, due to having a dense electrode arrangement, be provided with an attainable memory cell fill factor approaching unity and half the memory cells can in case be provided switchable in two or more directions, such that the fill factor of these in any case shall approach 0.5. A volumetric data storage apparatus with a very high storage density can hence be obtained, while several of the problems encountered with stacked memory devices are obviated.

4 Claims, 10 Drawing Sheets

VOLUMETRIC DATA STORAGE APPARATUS

The present invention concerns a volumetric data storage apparatus comprising a plurality of stacked matrix-addressable memory devices, wherein each memory device comprises first and second electrode means in the form of respective layers with parallel electrodes forming word lines and bit lines of the memory device for the matrix-addressing therof, wherein the second electrode means forms the first electrode means of a following memory device in the stack, wherein each memory device comprises a layer of memory material provided between the first and second electrode means and in direct or indirect contact therewith, wherein the memory material is a polarizable dielectric material capable of exhibiting hysteresis, preferably a ferroelectric or electret material, and wherein memory cells are defined in the memory material of a memory device at or between the crossings of the word lines and bit lines thereof.

From an architectural standpoint the passive matrix approach of memories with a ferroelectric polymer memory material in sandwich between the electrode layers is more attractive than the 1T-1C approach of state of the art silicon memory architectures, partly because it represents denser lateral storage ($4f^2$ versus $6f^2$ and larger, where f is the smallest definable feature), but even more because it allows stacking of successive memory layers, e.g. controlled from joint substrate circuitry. However, it is still a fact that even the $4f^2$ design only yields a 25% areal fill factor. With a 50% to nearly 100% fill factor the number of memory layers in volumetric stacked memories can be reduced, as will production complexity, yield and — cost. Also, using only one or two memory layers would reduce the effect of polymer postprocessing correspondingly and hence prevent the negative performance effects from such procedures.

The traditional approach to increase cell density is reducing cell area. However, the smaller the cell footprint, the smaller the signal (and the lower the signal-to-noise ratio), and more sensitive and hence more complex and real estate-demanding the read-out circuitry (dominated by sense amplifiers) must be provided. In fact it is considered extremely challenging to build crosspoint matrix systems of any kind with smaller line width than 0.30 Πm–0.40 Πm (cell size 0.09 Πm² to 0.16 Πm²).

A concern related to multi-layer stacking is planarization. Building successive layers on previous ones gradually produces a "curvy" or "bumpy" topography which creates substantial problems with regard to lithography control and hence the ability to address and read out from cells (e.g. sense amplifiers are designed relative to an expected cell area; if this, due to non-uniform lithography, varies beyond certain limits, the signal cannot be read out reliably—in other words, the difference between ones and zeros is more difficult to determine).

The architecture also defines the minimum number of mask steps that are required, the fewer, the less costly the manufacturing. Reducing the number of mask steps per bit is very important. A present polymer memory matrix for a typical device having 8 memory layers, may for instance require 19 more mask steps than a competing flash memory which means almost a near doubling of the costs to process such a wafer compared to state of the art CMOS processes for e.g. flash memory.

In a matrix-addressable ferroelectric polymer memory as proposed by the applicant using a vertical switching field, the morphology of the spin-coated polymer films largely decides the usability in memory applications. It is particularly challenging to maintain an optimal morphology in regard of ferroelectric properties when the film thickness shrinks below 100 nm. At such thicknesses the films are much more sensitive to type of solvents used, spin-coating and baking conditions, type and effect of interfacial/barrier layers, etc. Increasingly thinner films are desirable in order to reduce switching voltage, e.g. the films need to be thinner than 30 nm in order to achieve switching fields with a strength below 5V between the electrodes. Lower voltage levels are required in order to use progressively denser lithography and be compatible with related design rules, which also allow reduced power consumption. Low voltage is furthermore very attractive in polymer-based memories, since it allows more, ultimately all, circuitry to be built underneath the passive memory array, which again reduces effective cell footprint by reducing overhead footprint possibly to zero, and making vias and connections easier to design and implement.

However, to make such thin films with acceptable uniformity and morphology and no shorts, is very demanding over large areas (like a wafer), also because important ferroelectric properties, like crystallinity, tend to deteriorate with thinner films, while leakage and sneak currents represent an increasing problem. This again seriously affects the memory properties, e.g. the level of switchable and remanent polarization which is important for distinguishing between stored ones and zeros, the switching endurance and the switching speed. Especially high temperature performance at higher temperatures (e.g. >60° C.) seems to deteriorate tremendously.

But even thicker memory films experience a range of problems similar, if not so explicit, to those of thinner films. The preferred and established film application method approach is spin-coating, using an appropriate solvent. The choice of solvent, spin conditions, possible solvent residues, baking conditions relative to solvent choice, etc., represent great challenges regarding obtaining the correct combination of parameters, a challenge which is even much greater when thin films are concerned. Solvents must be used in order to obtain thin uniform films on wafer substrates.

Due to the switching voltage dependence of film thickness (discussed below), with reduced film uniformity, the coercive field will vary accordingly, which will create problems during operation if the variations are larger than the design maximum swing in voltage. On the other hand, the larger the design swing, the more complex the circuitry that is needed to handle it, with added costs in regard of real estate efficiency, production complexity and device cost.

Probably an even greater morphology concern is the fact that the polymer will be exposed to substantial postprocessing, e.g. deposition of top electrodes, interfacial layers, vias connections, etc. in multi-layered memory stacks. This amounts to a potentially severe negative impact on the polymer properties, which are very difficult to control properly, especially in a commercial manufacturing process.

The use of polymer and especially the fact that the electrodes rest directly onto this material which has a melting temperature of approximately 150θC, result in problems when packaging is concerned. In a typical soldering process, temperatures can reach as high as 210θC for limited periods, which causes problems for the architecture, since the polymer starts to melt and flow, such that the electrode/polymer film interface may be seriously damaged.

The data storage apparatus according to the invention is provided as a stack of a plurality of memory devices, and with the electrode means alternatingly forming word lines and bit lines of neighbouring devices, such that in the stacked memory data storage apparatus according to the invention the number of separate electrode means in the stack only is one more than the number of memory devices in the stack. This of course, implies that an addressing protocol must provide for only one memory device in the stack being addressed at the time or that at most every second memory device of the stack can be addressable simultaneously. Electrode means alternating as word and bit lines have been proposed in prior art disclosing stacked passive matrix-addressable memory devices, but they rely on conventional electrode and memory cell arrangements, although with electrode means provided substantially as thin film. While providing a structural simplification, they are not able to contribute to a significant increase in the storage density.

The main object of the present invention is thus to obviate the above-mentioned disadvantages and problems with prior art matrix-addressable data storage memory devices relying on polarizable memory materials capable of exhibiting hysteresis such as ferroelectric electrets and to provide a volumetric data storage apparatus comprising stacked matrix-addressable memory devices and with an extremely high data storage density.

A particular object of the present invention is also to obviate problems arising when the memory material is a polymer or a copolymer material, as mentioned above.

The objects of the invention as well as other advantages and features are realized with a volumetric data storage apparatus according to the invention which is characterized in that electrodes of each electrode means are provided in a dense arrangement and mutually insulated by barrier layer therebetween, the thickness δ of the barrier layer being only a fraction of the electrode width, whereby the area fill factor of the electrodes in an electrode means approaches unity, that the top surface of an electrode means facing the neighbouring following electrode means is provided with parallel recesses oriented orthogonally to the electrodes and mutually spaced apart by a distance comparable to the electrode width w, the parallel recesses having a cross-sectional shape conforming to the cross-sectional shape of the electrodes, that at least every second electrode of the adjacent following electrode means is provided extending downwards in the recesses formed in the adjacent preceding electrode means, that a memory material is provided in a layer over each electrode means covering the surface thereof as well at least the side walls and optionally the bottom of the recesses therein, and that the electrodes extending into the recesses in conjunction with the orthogonally crossing electrodes of the adjacent preceding electrode means define memory cells having at least two switching directions in the memory material provided in the recesses, whereby the volumetric data storage apparatus is provided with a very high storage density, and with every second of the memory cells in a layer of memory material capable of being switched in at least two directions.

The apparatus according to the invention shall now be explained in detail with a thorough discussion of its component parts and embodiments thereof as shown in the drawing figures, of which

Figure 1:
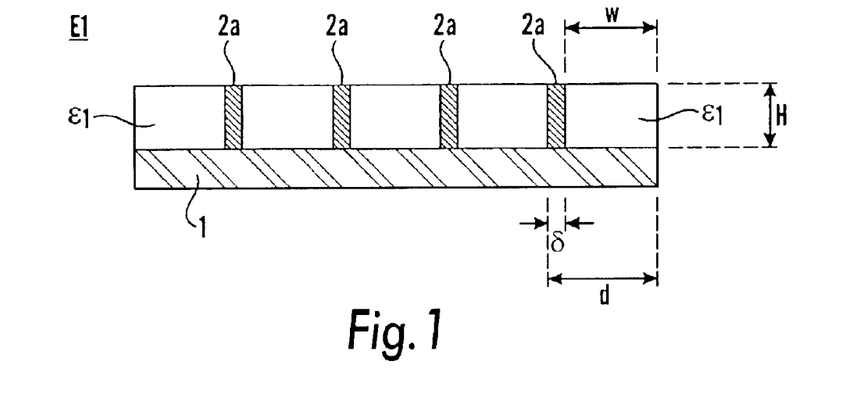
FIG. 1 shows a cross section through a first electrode means in the data storage apparatus according to the invention, FIG. 2 a plan view of the first electrode means in FIG. 1, FIG. 3a a cross section of the electrode means, taken along the line A—A in FIG. 2, FIGS. 3b–3f various steps for forming high aspect ratio electrodes of a second electrode means in the data storage apparatus according to the invention, these cross sections being viewed in the same direction as in FIG. 3a, FIG. 4 a first memory device in the data storage apparatus according to the invention and viewed in the same direction as the cross section in FIG. 3a, FIG. 5 a plan view of a first memory device in the data storage apparatus according to the invention, FIG. 6 a cross section through the data storage apparatus in FIG. 5, taken along the line B—B in FIG. 5, FIG. 7 the stacking of a second memory device on the top of the first memory device in the data storage apparatus according to the invention and viewed in the same direction as the cross section in FIG. 6, FIG. 8 a plan view of the data storage apparatus according to the invention with two memory layers, FIG. 9 a cross section through the data storage apparatus in FIG. 8, taken along line A—A in FIG. 8, FIG. 10 a cross section similar to the one in FIG. 9, but with a third memory device stacked on the top of the second memory device, FIG. 11a plan view of the data storage apparatus in FIG. 10 with a third memory device, FIG. 12a a cross section of a schematic embodiment of the data storage apparatus according to the invention with four memory devices, taken along the line B—B in FIG. 11, FIG. 12b a cross section through the data storage apparatus according to the invention and similar to the embodiment in 12a, but taken along the line A—A in FIG. 11, and FIG. 13 schematically the general structure and component parts of a functional data storage apparatus according to the invention.
Figure 2:
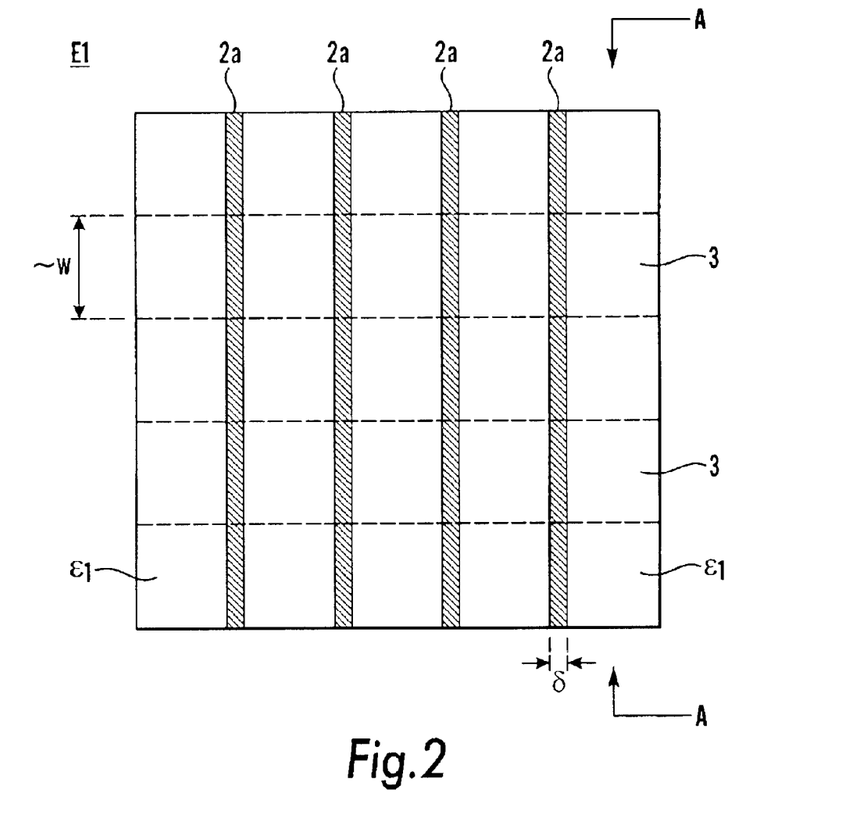

FIG. 1 shows a cross section of an electrode means $E_1$ in the apparatus according to the invention. The electrode means $E_1$ comprises a number of parallel electrodes $\epsilon_1$ which appears as strip-like in the plan view of the electrode means $E_1$ in FIG. 2. Each electrode $H_1$ is located on an insulating substrate 1 and separated only by means of an insulating thin film 2a which prevents ohmic contact between the separate electrodes $\epsilon_1$. The electrodes $\epsilon_1$ are realized with a height H and a width w, but with a fairly high aspect ratio H/w. The insulating thin film 2a has a thickness δ which is typically much smaller than the electrode width w and this implies that almost the whole area of an electrode means $E_1$ as its footprint appears in FIG. 2, is taken up by the electrodes $\epsilon_1$, while the insulating thin-film layer or barrier 2a between the electrodes occupies only a small part thereof (if 0.15 IIm line width or larger lithography is used; finer lithography reduces this difference). An electrode means of this kind can be fabricated by a method as disclosed in Norwegian patent application No. 20015509, filed 9 Nov. 2001, which belongs to the present inventor, and hence the actual method for fabrication of a dense electrode means of this kind shall not be elucidated in further detail herein. In that connection, however, it is to be remarked that the electrode width can conform to a minimum process-constrained feature f, the magnitude of which will be dependent on e.g. the design rules as applicable in for instance in a photomicrolithographic patterning process. Anyway, this implies that either the electrode width w or a distance d from one electrode to the next in the electrode means $E_1$ shall be subject to a design rule of this kind, while this need not be the case of the thickness of the insulating thin film which can be deposited by processes unconstrained by any conventional design rule. It also follows that the actual width of e.g. every second electrode ε in the electrode means E then can be smaller than the minimum process-constrained feature f by an amount 2δ, i.e. it will be the distance d=w+2δ that actually is constrained by the design rule.

Figure 3A:
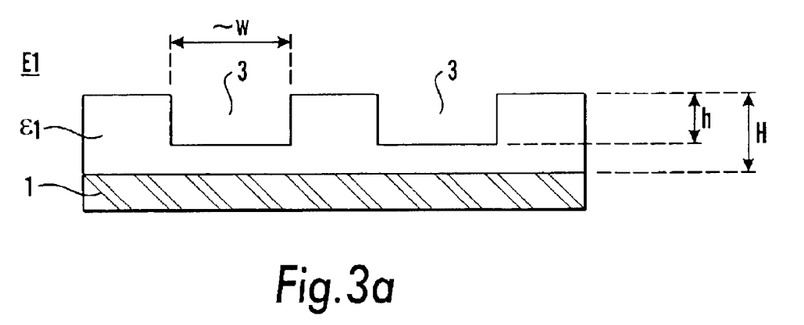

Concerning the plan view in FIG. 2, it shows the electrode means $E_1$ with recesses 3 formed and extending downwards from the top surfaces of the electrodes $H_1$ thereof. These recesses 3 which can have approximately the same width w as the electrodes $H_1$, extend perpendicularly to the electrodes $H_1$ of the electrode means E1 and are separated by remaining portions of the electrodes $H_1$ which similarly may have a width of approximately w. The recesses 3 extend from the top surface of the electrodes $H_1$ and towards the substrate by an amount h and have a substantially rectangular cross section. At the bottom of the recesses 3 the electrodes $H_1$ will be bridged by a section thereof extending to a height H–h above the substrate 1. It is to be understood that while h can be a larger fraction of H, the magnitude of h for a very small H may preferably be chosen as about 50% thereof. This is seen to advantage in FIG. 3a which shows a cross section of the electrode means E1 in FIG. 2 taken along the line A—A.

Figure 3B:
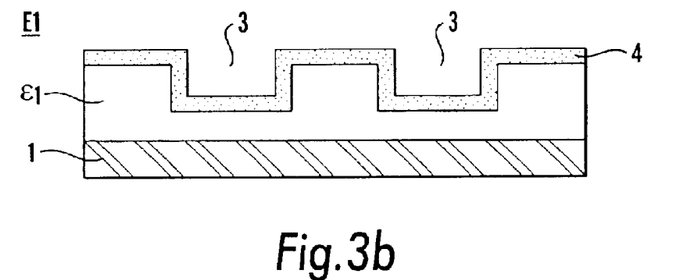
Figure 3C:
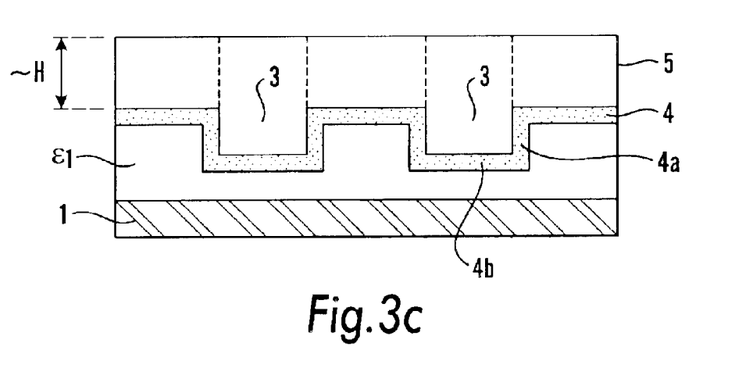
Figure 3D:
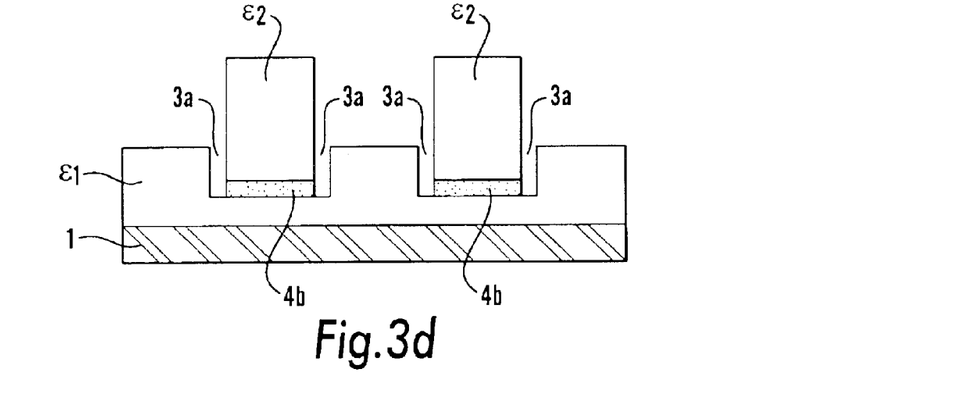
Figure 3E:
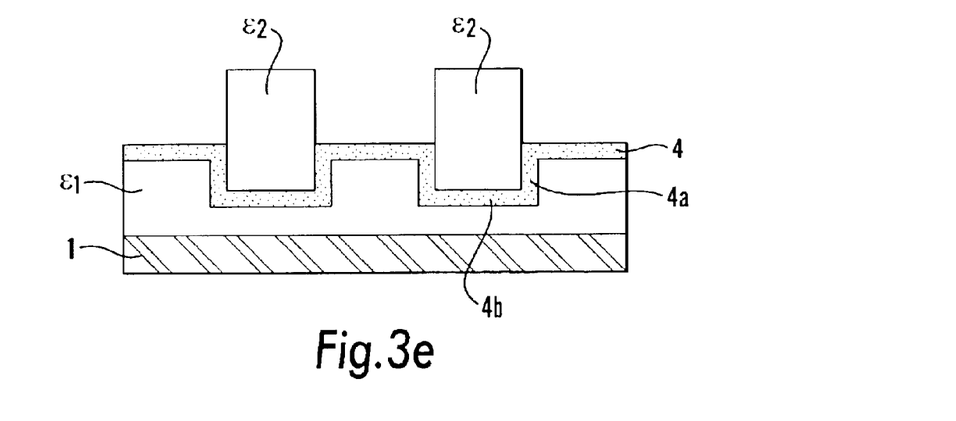

Now the process steps for forming a second electrode means $E_2$ in the data storage apparatus according to the invention shall be described with reference to FIGS. 3b–3f. In a first step shown in FIG. 3b the electrode means $E_1$ with the recesses 3 are covered by an insulating thin-film material 4. In a second step an electrode material 5, e.g. similar to that of the electrodes $H_1$, is deposited over the insulating thin film 4 to a height about H or larger. The electrode material 5 fills the recesses 3 completely. The insulating thin film 4 can be any dielectric thin-film material, hut preferably it will be a ferroelectric or electret thin-film material, of which more later. Now follows a third step for patterning electrodes $H_2$ with high aspect ratio and located in the recesses 3, oriented orthogonally to the electrodes $H_1$ of the first electrode means $E_1$. A first variant of the patterning step is shown in FIG. 3d. Here electrode material 5 as well as insulating thin-film material 4 is removed in an etching process, which can be a two-stage selective etching process first removing the superfluous electrode material 5 and then the insulating thin-film material 4 as shown in FIG. 3d, without in any way affecting the already deposited electrodes $H_1$. This leaves high aspect ratio electrodes $H_2$ located in the recesses on an insulating thin film 4b, but with grooves 3a between the sidewalls of the recesses 3 and the electrodes $H_2$ now formed therein. Memory material 4 is now added filling the grooves 3a and covering the top surface of the electrodes $H_1$ and the resulting structure appears as shown in FIG. 3e. However, if the thin-film material 4 deposited in step 1 as shown in FIG. 3b is a ferroelectric or electret memory material, the etching process can be such that only the superfluous electrode material 5 is removed and the structure with only a single etching step will then appear as depicted in FIG. 3e with the thin-film material 4 being a ferroelectric or electret memory material covering the surface of the electrodes $H_1$ completely, i.e. also with portions 4a covering the sidewall of the recesses 3 as well as portions 4b covering the bottoms of the latter. This implies that e.g. the ferroelectric thin-film material 4a and 4b respectively located at the sidewalls and the bottoms of the recesses 3 will form the memory material of respective memory cells addressable via electrodes $H_1$; $H_2$ of the electrode means $E_1;E_2$.

The high aspect ratio electrodes $H_2$ located in the recesses 3 are now in a fourth step covered with a thin film of insulating material 2. The thin film 2 of insulating material may e.g. be formed by selectively oxidizing the electrodes $H_2$. In a fifth and final process step additional electrode material is deposited between the electrodes $H_2$ as already present, that is as schematically rendered in FIG. 3f also in the empty portions not occupied by the electrodes $H_2$ located in and extending from the recesses 3. The resulting structure is shown in cross section in FIG. 4, and forms a first memory device $M_1$. Electrode means $E_2$ is now provided located on the top of electrode means $E_1$ with parallel and densely arranged electrodes $H_2$ running orthogonally to the electrodes $H_1$ of the first electrode means $E_1$. The electrodes $H_2$ of the second electrode means $E_2$ are similarly to the electrodes $H_1$ of the first electrode means $E_1$ separated mutually insulated by thin insulating barriers 2a. The memory material 41 of the first memory device $M_1$ in the data storage apparatus according to the invention is provided between the electrode means $E_1;E_2$ and memory cells 6 are formed at the crossings between respective the electrodes $H_1;H_2$ thereof as seen to advantage in FIG. 5. Every second electrode $H_2$ is located in a recess extending into and across the electrodes $H_1$ and at the crossings of these electrodes a memory cell 6 is formed in the recesses and can be switched in three directions as indicated by the double arrows oriented perpendicularly to the sidewalls of the recess as well as perpendicularly to the bottom thereof. The remaining electrodes $H_2$ of the electrode means $E_2$ are not located in the recesses and can be switched only in a single direction as indicated by the double arrow oriented perpendicularly to the memory material 4, of the first memory means.

Figure 4:
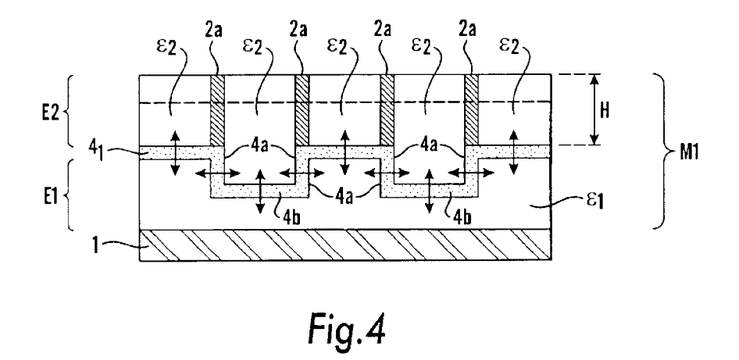
Figure 5:
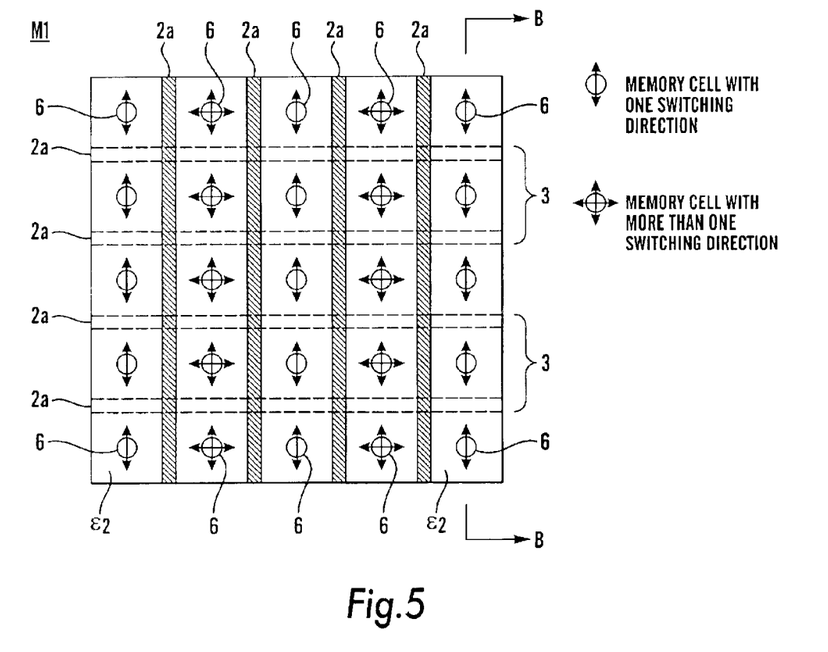

FIG. 5a shows a plan view of the finished structure, i.e. the first memory device $M_1$ shown in FIG. 4. It will now clearly be seen how the electrodes $H_2$ in the second electrode means $E_2$ are oriented perpendicularly to the electrodes $H_1$ of the first electrode means $E_1$. The memory material 4 and optionally also 4b provided between the electrodes $H_1$ and $H_2$ in the bottom of the recesses 3 and over the electrodes $H_1$ now form the memory medium $4_1$ in memory cells 6, of which a few is indicated by this reference number of the memory device $M_1$. The structure shown in FIG. 5 with memory material 4 and electrodes $H_1$, $H_2$ now provides a passive matrix-addressable array of memory cells 6 which particularly shall be ferroelectric or electret memory cells and even more particularly such as realized with the memory material 4 in the form of a polymer or a copolymer. From the cross section in FIG. 4 it will be seen that applying voltage to the electrodes $H_1$ and $H_2$, shall establish an electric potential therebetween over the memory material $4_1$. The memory cells 6 addressed by the electrodes located in the recesses 3 can be either polarized or switched in different directions. The portion of the memory cell at 4a can e.g. be switched in a lateral direction relative to the extension of the memory device $M_1$, while the optional portion of the memory material 4b at the bottom of the recess 3 can be switched in a direction perpendicular to the plane of the memory device $M_1$ or, as implied by FIG. 4, in the vertical direction. By doing so, three "regions" can be switched simultaneously, whereby a signal response about two times larger than that from a conventional sandwiched memory cell is obtained, because the area of the bottom region 4a equals the electrode crossing areas i.e. $w^2$, and the area of the two sidewall regions equals 2wh, where h≈½w. This introduces an extra dimension as compared with vertically switched memory cells as known in the art and implies that the active memory cell area will be independent of an otherwise applicable design rule.

Since a planarization step can be introduced between the deposition of each electrode layer as mentioned below, there need be no loss of lithographic density/film uniformity by adding successive layers, also meaning that apart from potential complications with regard to vias and connections, there is technically no limits to how many layers can be stacked in this manner, in contrast with the vertical architectures, where planarization becomes increasingly tough to achieve with successive layers.

A memory matrix of memory cells 6 is now obtained in the memory device $M_1$ and with an area fill factor similar to that of the area fill factor of the electrodes of the respective electrode means $E_1$, $E_2$. Every second memory cell 6 in the memory device can be switched in more than one direction and it should further be noted that the memory matrix is a passive addressable memory matrix, i.e. there are no discrete switching components connected with any of the memory cells 6.

Figure 6:
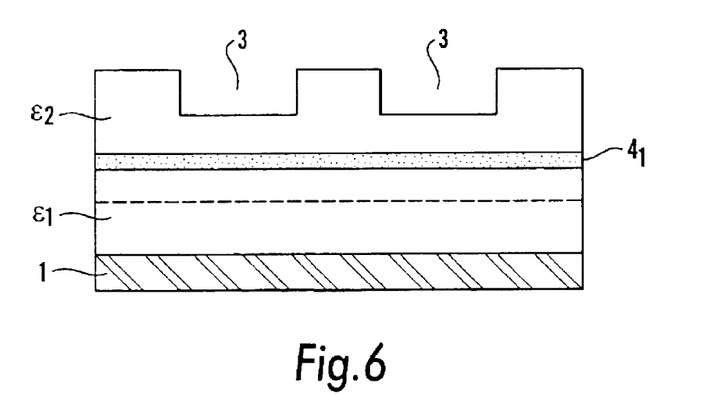
Figure 7:
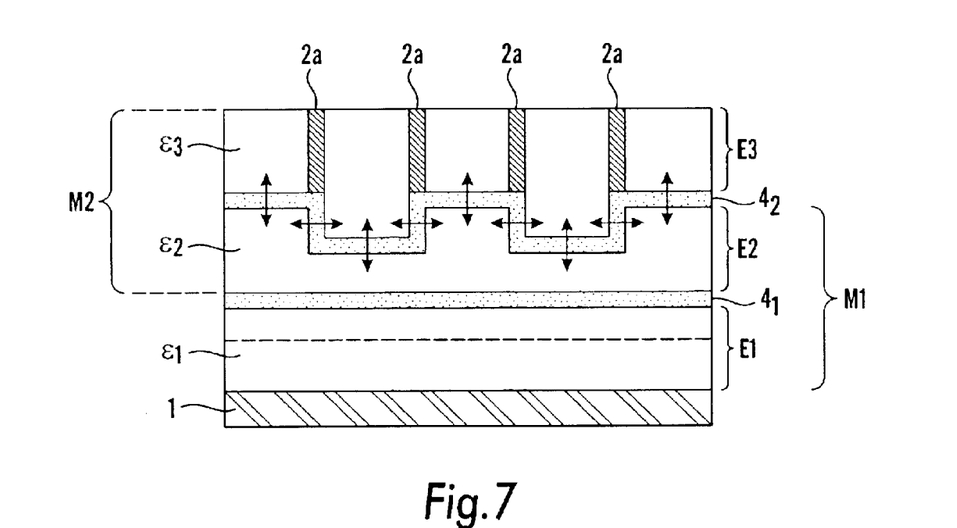
Figure 8:
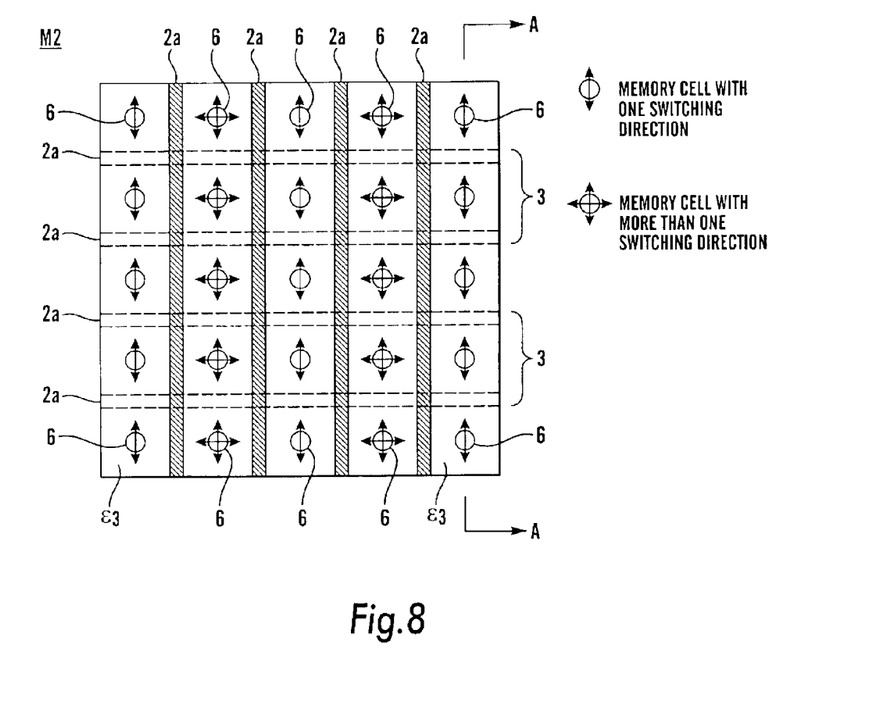

With reference to FIGS. 6,7 and 8 there shall now be described how a second memory device $M_2$ in the data storage apparatus according to the invention is formed and stacked atop the first memory device $M_1$ as depicted in cross section in FIG. 4. FIG. 6 shows another perspective of the cross section in FIG. 4 taken at right angles thereto, in other words along the line B—B in FIG. 5. Similar to the step shown in FIG. 3a recesses 3 are now formed in the electrodes $H_2$ of the electrode means $E_2$ and similarly oriented and dimensioned. Now the process steps as shown in FIGS. 3b–3f and discussed above are repeated and the resulting structure appears as shown in FIG. 7, but with an additional electrode means $E_3$ similar to electrode means $E_2$ in FIG. 4, but of course with the electrodes $H_3$ oriented orthogonally to the electrodes $H_2$ of electrode means $E_2$. A stitched horizontal line extending along the electrodes H, as depicted in FIGS. 6 and 7 indicates how far the recesses 3 extend into these electrodes. A second memory device $M_2$ stacked in the data storage apparatus according to the invention is thus formed with the electrode means $E_2$,$E_3$ and a similar arrangement of the memory cells 6. This can be seen to advantage in FIG. 8 which shows a plan view of the memory device $M_2$ as stacked at top memory $M_1$ and with memory cells 6 (again with only a few of these indicated by the reference numeral in a matrix-addressable memory array. Further it is also from FIG. 7 easily seen that the second memory device $M_2$ shares the electrode means $E_2$ with the preceding memory device $M_1$ in the stack. In other words, if the electrodes $\epsilon_1$ of electrode set $E_1$ form word lines in the memory device $M_1$ and the electrodes $\epsilon_2$ in the electrode means $E_2$ the bit lines thereof, correspondingly the electrodes $\epsilon_2$ of the electrode means $E_2$ shall form the word lines of memory device $M_2$, while the electrodes $\epsilon_3$ of the electrode means $E_3$ on the top of the structure as depicted in FIG. 7 form the bit lines of memory device $M_2$. This peculiar arrangement and its consequences shall be discussed in somewhat greater detail below.

The process steps as used for forming the stacked memory devices $M_1$ and $M_2$ can now, of course, be repeated to form as many memory devices M stacked in the initial structure as desired. This continued procedure shall be described in some detail with reference to FIGS. 9–12 relating to an exemplary embodiment of the data storage apparatus according to the present invention with four stacked memory devices $M_1$–$M_4$. It is, of course, to be understood that the embodiment at illustrated will be schematically rendered only without taking into account the actual scaling that will be applied under more realistic production conditions and hence of course the illustrated embodiment is only an indication of the actual capacity of the data storage apparatus according to the invention with regard to the attainable number of memory cells, stacked memory devices or data storage density.

Figure 9:
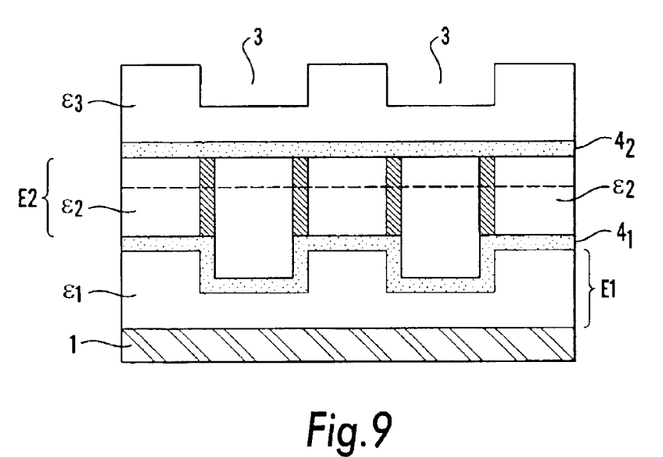
Figure 10:
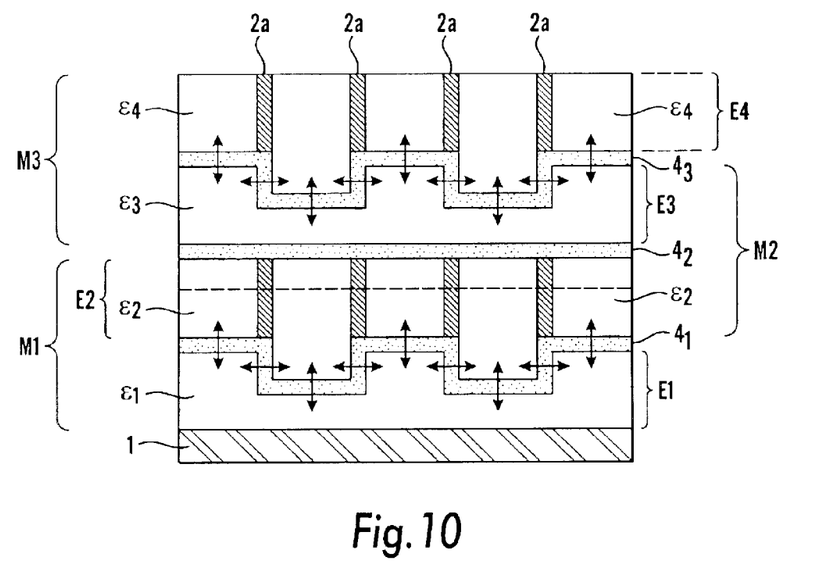

FIG. 9 shows a cross section of the data storage apparatus according to the invention taken along the line A—A in FIG. 8, thus showing a cross section viewed from a right angle to the view in direction of the cross section depicted in FIG. 7. Process steps similar to those steps depicted in FIGS. 3b–3f are now repeated and result in a memory structure as shown in FIG. 10, with three memory devices $M_1$, $M_2$, $M_3$ stacked upon each other and with four electrode means $E_1$–$E_4$ alternatingly providing the word lines and the bit lines of the stacked memory devices. A stitched horizontal line running through the electrode means $E_2$ both in FIG. 9 and FIG. 10 indicates how far down the recesses for the following electrode means $E_3$ extend into the electrodes $H_2$ of electrode means $E_2$. The switching directions of the resulting memory cells 6 in the memory devices $M_1$, $M_3$ are indicated by double arrows and are also apparent from FIG. 11, which shows a plan view of the apparatus in FIG. 10 viewed from above. As before every second memory cell 6 in a memory device is switchable in multiple directions, as apparent from the legend.

Figure 11:
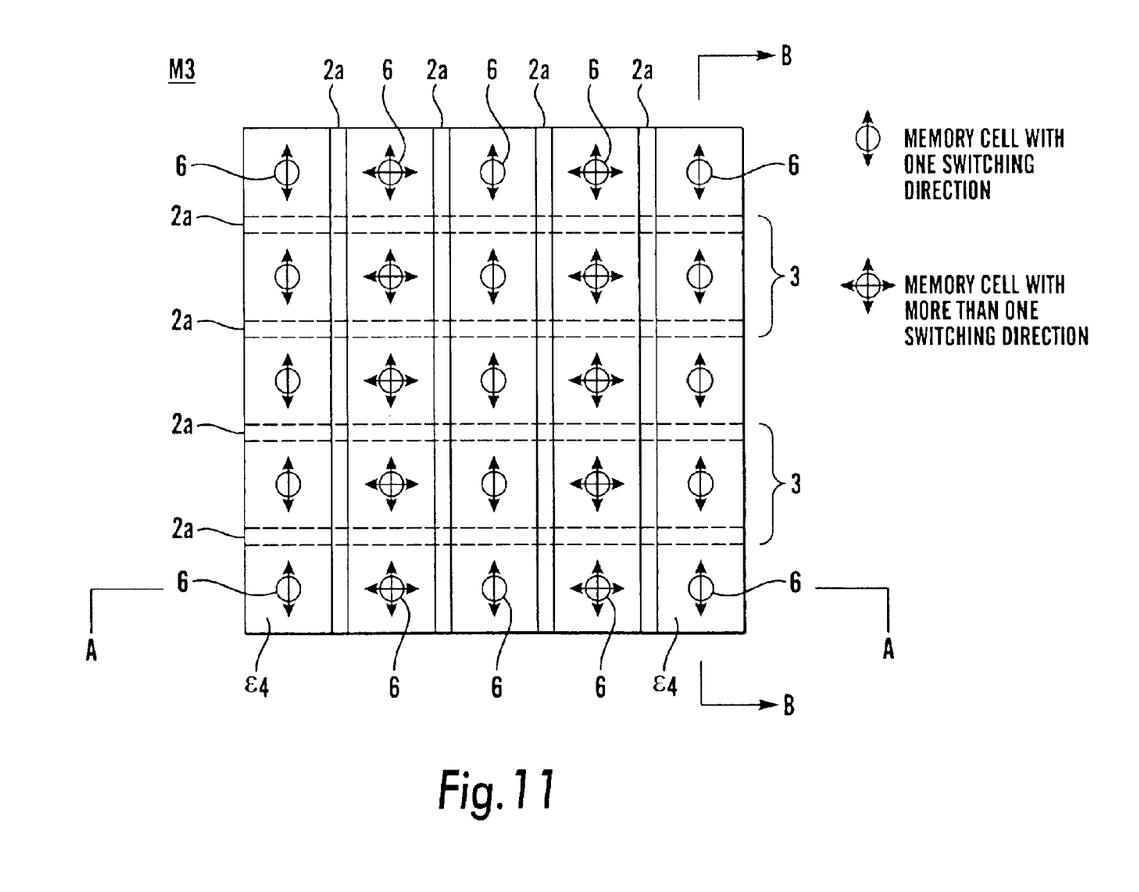
Figure 12A:
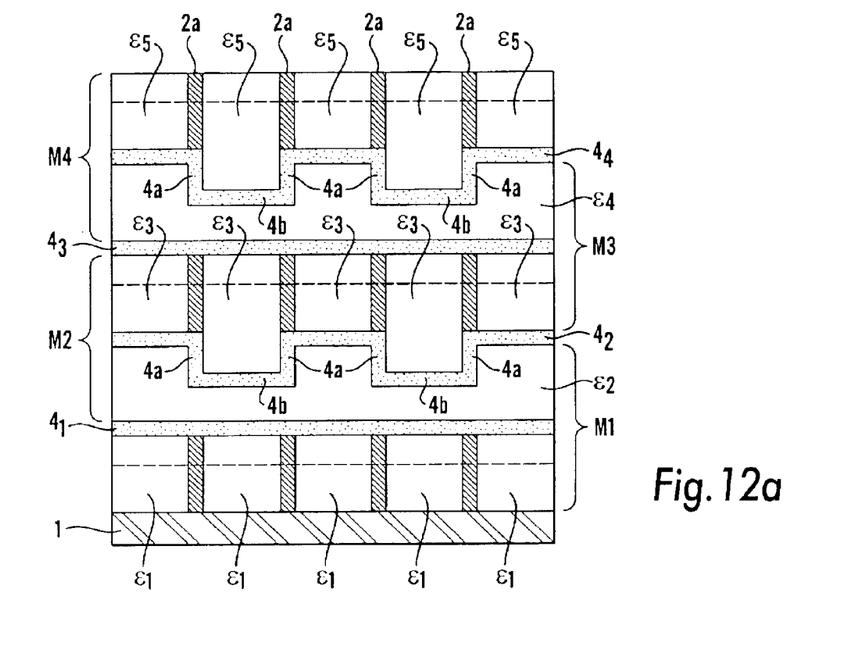
Figure 12B:
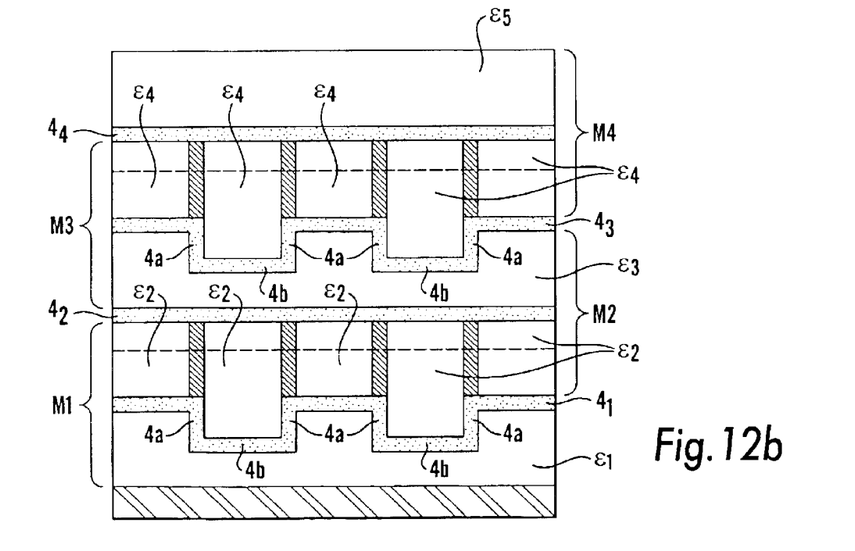

FIGS. 12a and 12b show schematic embodiments of a data storage apparatus according to the invention rendered as respective cross sections taken along respectively line A—A and line B—B in FIG. 11, such that the cross sections in line 12a and 12b are seen from viewing directions oriented perpendicularly to each other. The embodiment as depicted in FIGS. 12a, 12b provides altogether four stacked memory devices $M_1$–$M_4$ and electrodes means $E_1$–$E_5$ with the respective separate electrodes $H_1$–$H_5$ as indicated. Likewise is the downward extension of the recesses containing the electrodes of following electrode set indicated as applicable by horizontal stitched lines, which in the case of FIG. 12a run through the electrodes $H_1$,$H_3$ and in case of FIG. 12b through the electrodes $H_2$,$H_4$.

As will be seen, the electrodes $\epsilon_1$ can be regarded as the word lines of memory device $M_1$ while the electrodes $\epsilon_2$ can be regarded as bit lines thereof. Similarly the electrodes $\epsilon_2$ also form the word lines of the succeeding memory device $M_2$ and so on. The outcome is of course, that the data storage apparatus according to the invention is provided with a number of electrode sets which exceeds the number of memory devices by only one and hence in a stacked device of this kind e.g. comprises about half the number of electrode means compared to conventional prior art sandwich structures. This simplifies the structure and, of course, also reduces the height of the stack of memory devices. With electrode means E alternating as word lines and bit lines for the respective stacked memory devices M, the addressing protocol may take this in regard such that addressing shall not take place to adjacent neighbouring devices simultaneously. In case of the embodiment in FIGS. 12a, 12b, this implies that the memory devices $M_1$ and $M_3$ can be addressed simultaneously for either write, readout or erase, and similarly that the memory devices $M_2$, $M_4$ also can be addressed simultaneously for the same purposes. In other words, voltage applied to the electrodes $\epsilon_1$ and $\epsilon_2$ for addressing the memory cells in the memory layer $4_1$ of the memory device $M_1$ shall not influence or disturb the memory cells in memory layer $4_2$ of memory device $M_2$ to any significant degree, although in this case a potential difference may be present across the memory layer $4_2$ of memory device $M_2$. This can, however, be countered by adopting appropriate measures in the addressing protocols used, and an obvious measure would be to apply e.g. a similar voltage to the electrodes $\epsilon_2$, $\epsilon_3$ as applied to the electrodes $\epsilon_2$, ensuring that no potential difference is set up across the memory material $4_2$.

Various addressing protocols minimizing the so-called disturb of neighbouring cells are known in the prior art and also the subject of patent applications belonging to the present applicant. It should, however, be noted that protocols designed to avoid the disturb of unaddressed cells or mutual disturb effects between addressed cells usually are limited to embodiments where only each separate matrix-addressable memory device is taken into account and not particularly adapted to stacked embodiments wherein the electrode means are provided in a similar manner as is the case of the present invention. However, similar design philosophies can also be applied to a third dimension, i.e. to stacked structures where a disturb of memory cells in an addressed memory device is a possibility.

The data storage apparatus according to the invention provides a stacked memory offering the possibility of a very high data storage density and with a near optimum area fill factor in regard of either the electrodes or the memory cells, as said fill factor in any case approaches a value close to unity. For each electrode means only two etching or patterning steps are required, namely a first patterning or etching step to produce the dense electrode arrangement in the first electrode means $E_1$ followed by the etching of recesses 3 in the same. It should, however, be noted that the same mask could be used for both steps simply by orienting the mask with 90° angular shift for the process step depicted in FIG. 3a. Also the deposition of the barrier or memory material and the electrode material 5 can take place in two consecutive steps, as depicted in FIGS. 3b and 3c. Only one masking operation is then required to obtain a structure as depicted in FIG. 3e. The same mask as used for obtaining the first electrode means $E_1$ can suitably oriented be applied also to all masking steps for the following electrode sets $E_2$, $E_3$ and so on, given that the same dimensional parameters are used. This shall considerably serve to reduce process costs in case of the data storage apparatus according to the invention.

Concerning the memory cells as e.g. depicted in FIG. 10, it will be seen that half the number of the memory cells can be switched in one direction only, namely in the case where the memory material is sandwiched between the electrodes forming the word line and the bit lines for a memory cell in question, while in case the electrodes are provided in the recesses formed in the preceding electrode means, the memory cell now can be switched in more than one direction, e.g. as shown in FIG. 10 in three directions. Observing that the depth h of a recess 3 may be at least comparable to half the height H of the preceding electrode, it is clear that the memory material or memory film 4 which covers both the sidewalls as well as the bottom of the recess presents a much larger surface area to the addressing word line and bit line than is the case for a simply sandwiched memory material. The switching in all directions shall of course take place simultaneously and such that effective cell area may be more than doubled and the signal noise ratio improved by a factor of at least 2.

It will be seen that increasing the aspect ratio of the electrodes H and providing for deeper recesses would increase the effective memory cell area. It should be noted that the area of the vertical portions of a memory cell is not a critical factor when the applied lithographic technique is downscaled to pitches and line widths offered by using photolithography in the extreme or hard UV range. It should also be noted that increasing the effective cell area and improving the signal-to--noise ratio of the cell when addressed, e.g. in a destructive readout operation effecting a reversal of the polarization of the switching direction of polarization of the memory cell, shall serve to alleviate the detrimental effects of so-called fatigue, a phenomenon that can appear after a certain large number of switching operations and manifests itself in that the attainable polarization of the memory cell tends to decrease with an increasing number of switching cycles.

Figure 3F:
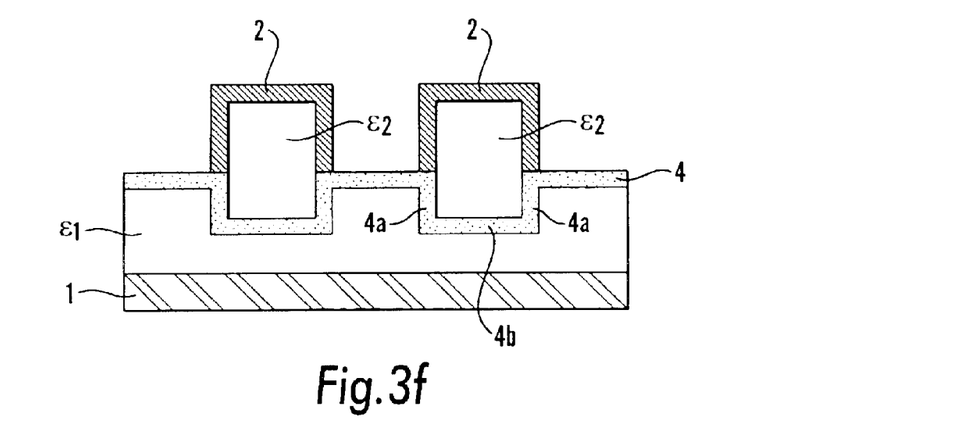

The bumpiness that is likely to appear when stacking very large number of memory devices with each layer in the memory device being composed of thin films, is easily avoided by applying a planarization step as the final process step in the fabrication of each electrode means. This can be seen by an inspection of FIG. 4 which shows a section through a memory device with two electrode means $E_1$,$E_2$ and wherein the insulating material 2 on the top of the electrodes $\epsilon_2$ as shown in FIG. 3f is removed when the remaining electrodes $\epsilon_2$ in this electrode means $E_2$ is deposited. Of course, leaves insulating barriers 2a between the electrodes $\epsilon_2$, but the removal process also can also be used to planarize the top surface of the electrode means $E_2$ as the removal process may incorporate either a mechanical or chemomechanical polishing. The electrode means $E_2$ is thus provided with a smooth top surface and ready for proceeding to the process steps for the next memory device in the stack.

In principle there is only a practical limit to how many layers that can be provided or how many memory devices that can be stacked to form the volumetric data storage apparatus according to the invention. An obvious limitation in the number of stacked memory devices would be the necessity to connect all electrodes and implicitly all memory cells to driver and control circuitry located in the substrate 1 or an appropriate circuitry provided in connection with this substrate, which e.g. may be made of silicon and with circuitry as stated realized in say an appropriate CMOS technology. For a given storage capacity an increase in the area fill factor of the memory cells now corresponding to a scaling down of the pitch shall, of course, make possible an outcome with fewer memory devices in the stack while retaining the desired storage capacity. Another solution to the connectivity problem would of course be to provide circuit areas for driving and control purposes in the memory device in the stack, thus avoiding the necessity for vias to the substrate at least to a considerable degree.

The embodiment of the data storage apparatus according to the invention as depicted in FIGS. 12a and 12b is of course purely schematic, showing only four memory devices with 25 memory cells in each and a total of 100 memory cells, of which in the present case only 40 are memory cells with multiple switching directions. However, in a normal embodiment would in practice every second memory cell be switchable in multiple directions and the fill factor of such cells in each memory device would hence approach 0.5. The obvious advantages of memory cells that can be switched in multiple directions imply that ordinary memory cells in sandwich and switchable only in one direction might be less attractive and could simply be thrown out of the design as the highly adequate fill factor of 0.5 still is obtainable. In this case of course the electrode material would only be applied to form electrodes provided in the recesses in a preceding electrode means and the channel-like openings therebetween e.g. could be completely filled with barrier material.

In a practical embodiment as easily attainable within today's technology a data storage apparatus conforming to FIG. 12a and FIG. 12b and as depicted with 4 memory devices and 100 memory cells could be provided with line widths of about 0.5 IIm and a pitch of about 1 IIm since the thickness Γ of the barrier between the electrodes is only a tiny fraction of the electrode width w.

Figure 13:
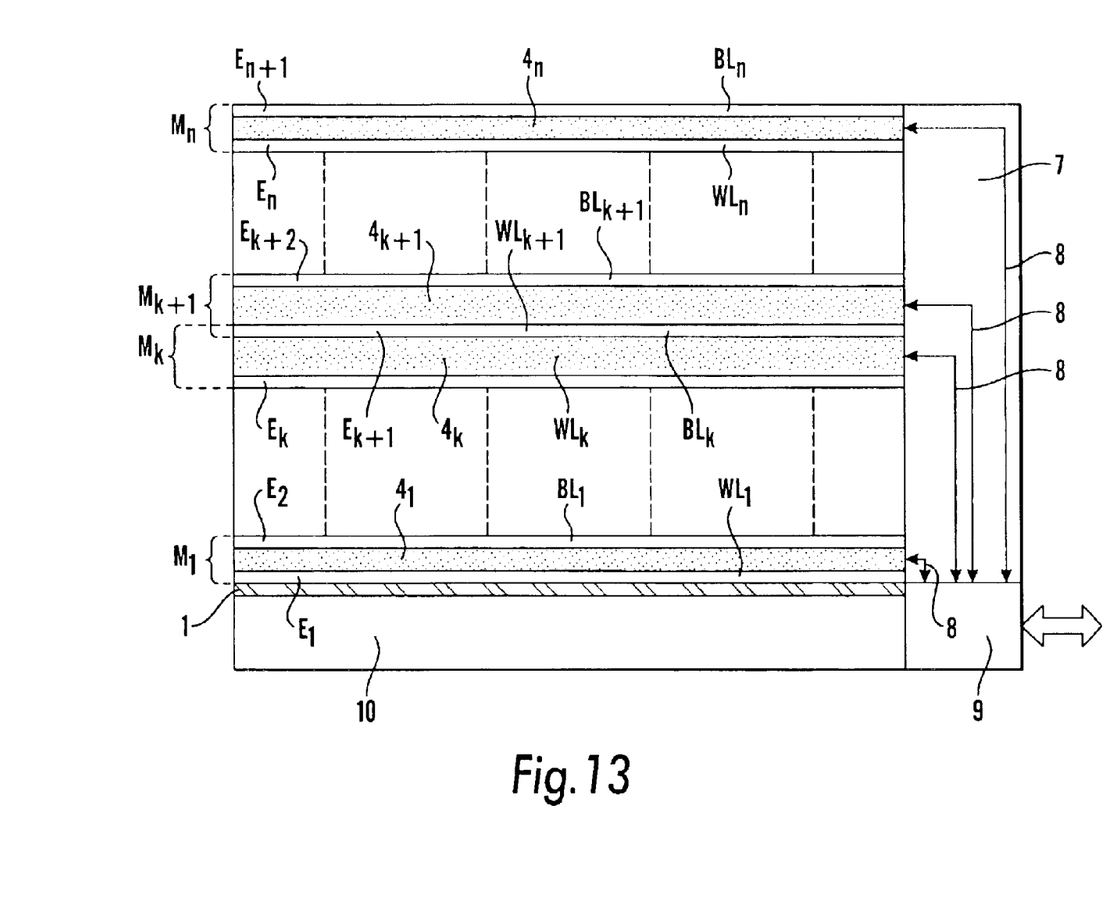

A more realistic approach to a functional embodiment to the data storage apparatus according to the invention is shown in FIG. 13, although, of course, schematically and generalized, but incorporating all functional parts necessary for its operation. The data storage apparatus in FIG. 13 is depicted with n stacked memory devices $M_1$–$M_n$ stacked atop each other and each of the memory devices comprises a layer 4 of memory material as shown. For the addressing of each memory device M two electrode means E are provided with not shown electrodes contacting the layer 4 of the memory material and forming word lines WL and bit lines BL for contacting the memory cells of the memory device M. The bit lines, of course, now form the word lines of the adjoining following memory device. In FIG. 13 it will e.g. be seen that for an arbitrary memory device $M_k$, the following memory device being $M_{k+1}$ the electrode means $E_{k+1}$ which provide the bit lines $BL_k$ of the memory device $M_k$ now forms the word lines $WL_{k+1}$ of the memory device $M_{k+1}$. Consequently electrode means $E_{k+2}$ shall of course provide the bit lines $BL_{k+1}$ of the memory device $M_{k+1}$ and so on. The outcome is, of course, that the number of electrode means is n+1, i.e. one larger than the number n of the memory devices M in the data storage apparatus according to the invention. The stacked memory devices M are located on an insulating substrate 1 which, however, can be regarded as part of the substrate 10 which may be implemented in silicon technology and comprise circuitry for driving, controlling and addressing the memory devices M in the thereabove located stack. For this purpose the data storage apparatus according to the invention comprises an interconnect or interface portion 7 at the side edge of the memory devices wherein vias or connections 8 from each memory device M and down to a substrate interface 9 are used for establishing the necessary communication between the circuitry portion 10 of the substrate and the memory devices M. Moreover the substrate interface 9 can additionally be provided with connections to external or peripheral devices or computing devices, but this substrate interface can also be used for integrating the data storage apparatus according to the invention in any data processing apparatus wherein suitable high capacity memories, viz. large data storage density, shall be required.

The line widths and pitch as given above imply four memory cells to each square micrometer, or 4 million cells in case each memory device has an extension of 1 mm×1 mm. The stack of four would then cater for 16 million memory cells or a 1 mm² chip and as the thickness e.g. could be in the order of 1 $\mu$m, this would imply a volumetric storage density of 16 Gbit/mm³. Reducing the line width to 0.2 $\mu$m which is possible with today's photo-lithographic techniques, the memory device of the data storage apparatus according to the invention would accommodate 25 memory cells in 1 $\mu$m² and with a stack of 4 memories scaling to 1 $\mu$m³ a volumetric storage density of 100 Gbit/mm³ can be provided. A scalability of this order would be perfectly attainable with today's technology, although special care would be taken to solve problems in regard of connectivity or arising from possible physical disturbances whether thermal or electrical. Experiments performed by the applicant indicate that such problems, however, shall be manageable and scaling of the data storage apparatus according to the invention can be done to the extremes permissible by present day technology for patterning.

What is claimed is:

1. A volumetric data storage apparatus comprising a plurality of stacked matrix-addressable memory devices, wherein each memory device comprises first and second electrode means in the form of respective layers with parallel electrodes forming word lines and bit lines of the memory device for the matrix-addressing thereof, the word lines being oriented orthogonally to the bit lines for the matrix-addressing of a memory device, wherein each memory device comprises a layer of memory material provided between the first and second electrode means and in direct or indirect contact therewith, wherein the second electrode means forms the first electrode means of a following memory device in the stack, whereby the number of electrode means becomes one more than the number of memory devices in the stack, wherein the memory material is a polarizable dielectric material capable of exhibiting hysteresis, preferably a ferroelectric or electret material, and wherein memory cells are defined in the memory material of a memory device at or between the crossings of the word lines and bit lines thereof, wherein electrodes of each electrode means are provided in a dense arrangement and mutually insulated by barrier layer therebetween, the thickness $\delta$ of the barrier layer being only a fraction of the electrode width, whereby the area fill factor of the electrodes in an electrode means approaches unity, that the top surface of an electrode means facing the neighbouring following electrode means is provided with parallel recesses oriented orthogonally to the electrodes and mutually spaced apart by a distance comparable to the electrode width w, the parallel recesses having a cross-sectional shape conforming to the cross-sectional shape of the electrodes, that every second electrode of the adjacent following electrode means is provided extending downwards in the recesses formed in the adjacent preceding electrode means, that a memory material is provided in a layer over each electrode means covering the surface thereof as well at least the side walls and optionally the bottom of the recesses therein, and that the electrodes extending into the recesses in conjunction with the orthogonally crossing electrodes of the adjacent preceding electrode means define memory cells having at least two switching directions in the memory material provided in the recesses, whereby the volumetric data storage apparatus is provided with a very high storage density, a memory cell fill factor of each memory layer of each memory device approaching the value of the area fill factor for the electrodes of the electrode means and with every second of the memory cells in a layer of memory material capable of being switched in at least two directions.

2. A volumetric data storage apparatus according to claim 1, wherein all layers of a memory device are provided as substantially thin films.

3. A volumetric data storage apparatus according to claim 1, wherein the memory material is a ferroelectric or electret material, wherein the ferroelectric or the electret material is a polymer or a copolymer material.

4. A volumetric data storage apparatus according to claim 1, wherein each electrode means are formed as a composite of two or more layers, a first layer consisting of a metal and a second layer of a conducting polymer, said second layer of conducting polymer forming a contact layer directly contacting the memory material of the memory device.

* * * * *

UNITED STATES PATENT AND TRADEMARK OFFICE
CERTIFICATE OF CORRECTION

PATENT NO.    : 6,952,361 B2
DATED         : October 4, 2005
INVENTOR(S)   : Geirr I. Leistad et al.

It is certified that error appears in the above-identified patent and that said Letters Patent is hereby corrected as shown below:

Title page,
Item [73], Assignee, change from, "Thin Film Electronics, Oslo (NO)" to
-- Thin Film Electronics ASA, Oslo, (NO) --.

Signed and Sealed this

Seventh Day of March, 2006

JON W. DUDAS
*Director of the United States Patent and Trademark Office*